United States Patent [19]

Murphy et al.

[11] Patent Number: 4,639,899

[45] Date of Patent: Jan. 27, 1987

[54] MEMORY CIRCUIT HAVING A MEMORY RESET AND RECOVERY CONTROLLER

[75] Inventors: Colin N. Murphy, San Mateo; Guey T. Lu, San Jose, both of Calif.

[73] Assignee: Advanced Micro Devices, Inc., Sunnyvale, Calif.

[21] Appl. No.: 536,920

[22] Filed: Sep. 27, 1983

[51] Int. Cl.$^4$ .................. G11C 7/00; G11C 11/40
[52] U.S. Cl. ........................... 365/230; 365/154; 365/203
[58] Field of Search .............. 365/190, 218, 230, 154, 365/181, 203, 205, 207, 208

[56] References Cited

U.S. PATENT DOCUMENTS 4,301,535  11/1981  McKenny ..................... 365/185
4,349,894  9/1982  Caudel ......................... 365/190

Primary Examiner—James W. Moffitt
Attorney, Agent, or Firm—Patrick T. King; Martin C. Fliesler; Warren Becker

[57] ABSTRACT

A memory circuit for storing data words including a core memory having a matrix of rows and columns of core cells which store bits of the data words, a row address decoder circuit for driving the rows, and a control signal generator, operative over one reset period and one recovery period, for controlling the columns and the row address decoder circuit to simultaneously charge the contents of the entire core memory to one data state.

24 Claims, 4 Drawing Figures

MEMORY CIRCUIT HAVING A MEMORY RESET AND RECOVERY CONTROLLER

BACKGROUND OF THE INVENTION

1. Field of the Invention

The present invention relates generally to apparatus for controlling a data storage circuit and, more particularly, to a memory circuit having a memory reset and recovery controller for controlling the content of stored data words.

2. Discussion of Background and Prior Art

A wide variety of data storage circuits is used for storing and accessing information. Typically, the data storage circuit has a memory which stores many data words, with each data word having a number of bits. The higher the capacity of the memory, the higher the number of data words that can be stored. Access to the data words is normally achieved by using an addressing scheme for addressing the plurality of data storage locations of the memory at which the data words are stored.

For many reasons, it may be necessary to periodically change the contents of the entire memory to store all the data words at one data state, i.e., all logic 1 or all logic 0 bits. For example, the entire memory may have to be cleared, so that it is available for use in processing new data. Consequently, the contents of the memory will be changed to, for example, all logic 1 bits.

A prior technique for changing the contents of the entire memory to one data state includes accessing individually every data word and, at each access, writing the one data state for the data word. The steps of accessing and writing one data word can be considered to constitute a reset period. A recovery or set period occurs after each data word is changed to the one data state, so that ultimately the memory is available for normal read and write accesses.

One problem with the prior technique is that the data words must be individually accessed and written to change the contents of the memory to the one data state. If the capacity of the memory is N data words, then N reset and recovery periods are required to so change the memory. Therefore, the total time to change the contents of the memory, particularly for a high capacity memory, can be undesirably long.

SUMMARY OF THE INVENTION

It is an object of the present invention to minimize the time required to change the contents of a memory of a given capacity to one data state.

Another object of the present invention is to minimize the time required to change the contents of a memory of any capacity to one data state.

The above and other objects of the present invention are obtained through the use of an apparatus for controlling a data storage circuit including a data storage medium having a plurality of data storage locations for storing data words, comprising means for controlling the data storage circuit to simultaneously reset the plurality of data storage locations to erase the data words, and means for controlling the data storage circuit to simultaneously set the plurality of data storage locations to store the data words at one data state.

Preferably, the apparatus includes a control signal generator which is operative over one reset period for generating a number of signals to access and clear the contents of the entire data storage medium and which is operative over one recovery period to produce a transition of these signals to set the contents of the entire memory at one data state and to thereafter enable the memory for normal read and write accesses.

DETAILED DESCRIPTION OF THE INVENTION

Reference will now be made in detail to the present preferred embodiment of the invention, an example of which is illustrated in the accompanying drawings.

Figure 1:
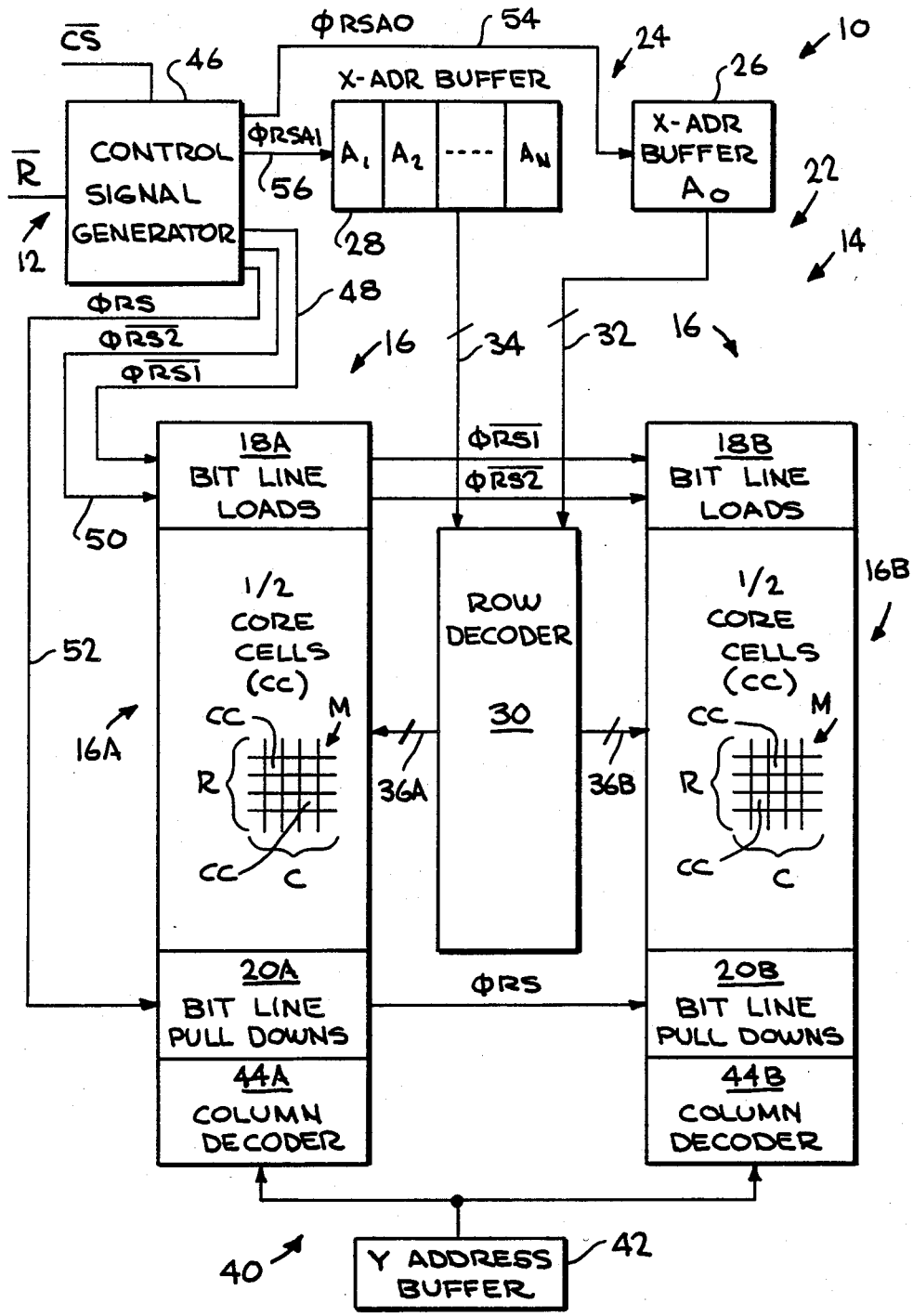
FIG. 1 is a block diagram of one embodiment of a data storage circuit.

FIG. 1 illustrates a data storage circuit shown generally at 10 that is controlled by a control apparatus shown generally at 12 in accordance with the principles of the present invention. The data storage circuit 10 has a data storage medium shown generally at 14 for storing data words. As one example, the data storage medium 14 can be a static random access memory (SRAM) 16 having a core memory 16A having one half the overall capacity of SRAM 16 for storing the data words and a core memory 16B having the remaining one half of the capacity of SRAM 16 for storing the data words. While the present invention will be discussed in relation to the SRAM 16, the principles of the present invention apply to a data storage circuit 10 having other types of data storage media. Furthermore, while the principles of the present invention also will be described in relation to an SRAM 16 having both a core memory 16A and a core memory 16B, it will become apparent that the invention can be applied solely to either core memory 16A or core memory 16B, or to an SRAM 16 that is not divided into two such core memories 16A, 16B.

Generally, control apparatus 12 controls the data storage circuit 10 to simultaneously change the contents of all the data words stored in the SRAM 16 to one data state. For example, the contents of the entire SRAM 16 can be changed to a logic 1 or a logic 0 data state. To make such a change, control apparatus 12 controls the data storage circuit 10 to simultaneously reset the SRAM 16 to erase the data words stored in the SRAM 16 and then controls the data storage circuit 10 to simultaneously set the SRAM 16 to store the data words at the one data state. As will be further described, control apparatus 12 is operative over one reset period to reset the entire SRAM 16 and is thereafter operative over one recovery period to set the entire SRAM 16.

More specifically, core memory 16A has a matrix M of rows R and columns C comprising core cells CC, constituting data storage locations for storing the data words. Core memory 16A also has bit line loads 18A for loading or charging the columns C and, hence the core cells CC, and bit line pulldowns 20A for pulling down or discharging the columns C and, hence, the core cells CC, as will be described more fully in connection with FIG. 2. Similarly, core memory 16B has bit line loads 18B and bit line pulldowns 20B, together with the matrix M of rows R, columns C and core cells CC.

To access the data words, the data storage circuit 10 has a row address decoder means shown generally at 22 for driving on and off the rows R of core memory 6A and core memory 16B. The row address decoder means 22 includes an X-address buffer 24 which, for reasons to be described below, buffers an address bit $A_0$ via a buffer 26 and buffers address bits $A_1$-$A_N$ via a buffer 28. A row decoder 30 responds to the buffered address from buffer 24 via a path 32 coupled to buffer 26 and a path 34 coupled to buffer 28 to drive on or off, via path 36A, rows R of core memory 16A and, via path 36B, rows R of core memory 16B.

As will be further described, address buffer 24 is controlled by control apparatus 12 to operate normally for normal read and write accesses to core memory 16A and core memory 16B, whereby row decoder 30 decodes the addresses in address buffer 24 to drive on only one row R at a time of the core memory 16A and one row R of the core memory 16B. However, to simultaneously change the contents of core memory 16A and core memory 16B, address buffer 24 is controlled by control apparatus 12 to output on path 32 and path 34 all lows or logic 0's, whereby row decoder 30 responds by simultaneously driving on all the rows R. Having caused all the rows R to be driven on simultaneously, control apparatus 12 thereafter first causes one half of the rows R to be driven off, followed by causing the other half of the rows R to be driven off, as will be further described.

The data storage circuit 10 also includes column address decoder means shown generally at 40 for accessing the columns C. Column address decoder means 40 includes a Y-address buffer 42 which buffers and outputs addresses to a column decoder 44A for accessing the columns C of core memory 16A and a column decoder 44B for accessing the columns C of core memory 16B.

Control apparatus 12 includes a control signal generator 46 for generating, in response to an external chip select signal $\overline{CS}$ and an external reset signal $\overline{R}$, a plurality of control signals over respective lines 48, 50, 52, 54 and 56. As will be further described, a control signal $\overline{\phi RS1}$ is produced on line 48 and a control signal $\overline{\phi RS2}$ is produced on line 50 to control the bit line loads 18A and the bit line loads 18B. A control signal $\phi RS$ is produced on line 52 to control bit line pulldowns 20A and bit line pulldowns 20B. Another control signal $\phi RSA0$ is produced on line 54 to control the buffer 26 and yet another control signal $\phi RSA1$ is produced on line 56 to control the buffer 28.

Figure 2:
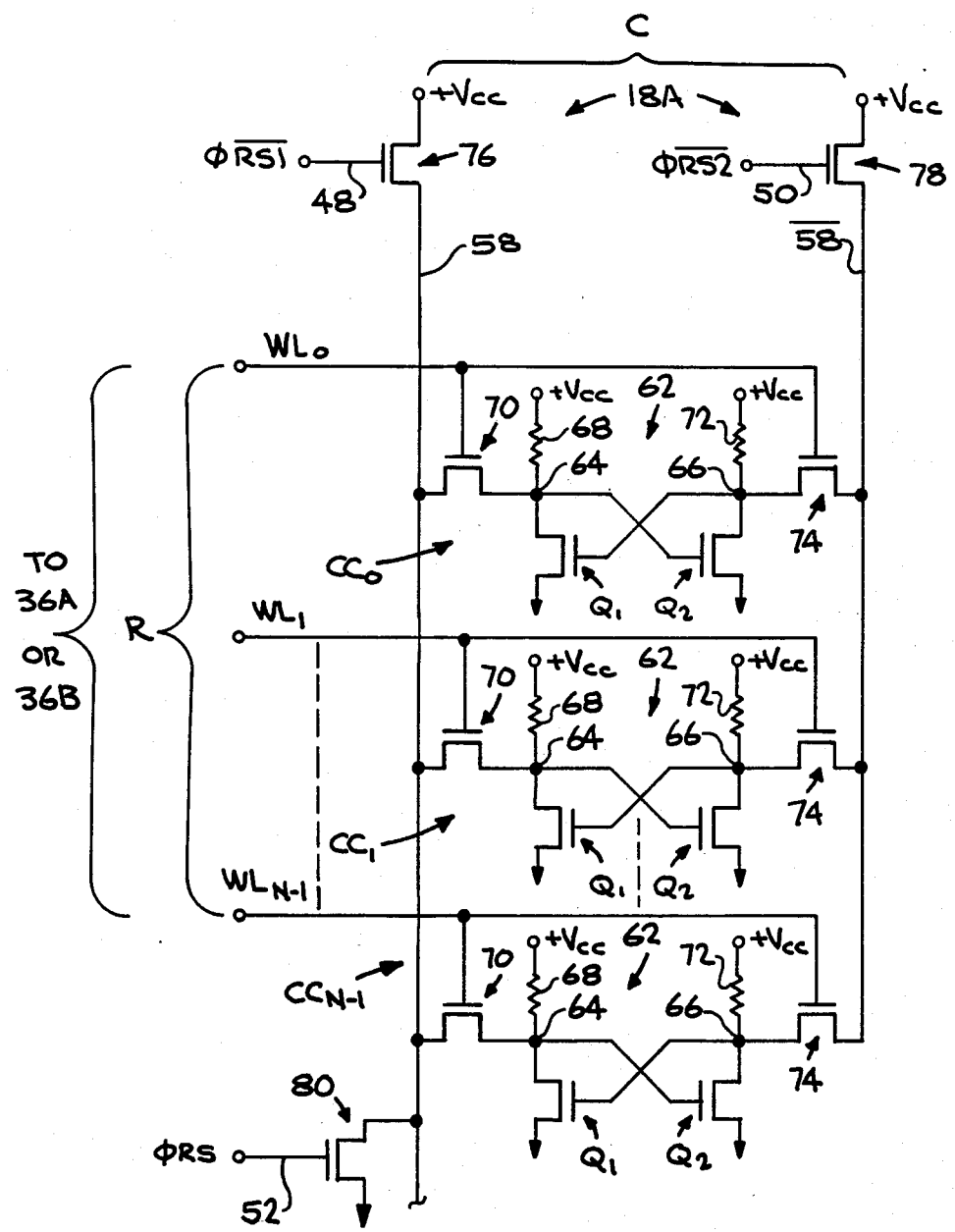
FIG. 2 is a schematic illustration of a portion of a data storage medium of the data storage circuit of FIG. 1.

FIG. 2 shows a portion of the matrix M of either core memory 16A or core memory 16B, in particular, one exemplary column C together with the plurality of rows R. The column C includes a first bit line 58 and a second bit line $\overline{58}$, which, in a conventional manner, constitute paired bit lines carrying the same bit in complementary states. More specifically, line 58 and line $\overline{58}$ carry a differential voltage representing the bit. The rows R constitute word lines $WL_0$-$WL_{N-1}$, where N is the number of rows R. Also shown for a column C and word lines $WL_0$-$WL_{N-1}$ are core cells $CC_0$-$CC_{N-1}$, each storing one bit of a data word stored along a respective row R. Each core cell $CC_0$-$CC_{N-1}$ has a cross-coupled latch 62 with a node 64 at one side of the core cell and a node 66 at the other side of the core cell, together with cross-coupled transistors $Q_1$ and $Q_2$. Node 64 can be charged to a voltage level via a power source $+V_{CC}$ and a resistor 68, and is coupled to the bit line 58 via a transistor 70. Node 66 can be charged to a voltage level via the power source $+V_{CC}$ and a resistor 72, and is coupled to the bit line $\overline{58}$ via a transistor 74. Each word line $WL_0$-$WL_{N-1}$ drives on and off the transistors 70, 72 of the respective core cells $CC_0$-$CC_{N-1}$.

The bit line 58 has a transistor 76 for coupling the power source $+V_{CC}$ to nodes 64 of the core cells $CC_0$-$CC_{N-1}$ via the respective transistors 70. The bit line $\overline{58}$ includes a transistor 78 for coupling the power source $+V_{CC}$ to the nodes 66 of the core cells $CC_0$-$CC_{N-1}$ via the respective transistors 74. The transistor 76 and transistor 78 correspond to two of the bit line loads 18A or bit line loads 18B shown in FIG. 1. Each bit line 58 also has a transistor 80 for coupling the bit line 58 to digital ground, as well as nodes 64 via transistors 70. The transistor 80 corresponds to one column's pulldown in one of the bit line pulldowns 20A or bit line pulldowns 20B shown in FIG. 1.

The control signal $\overline{\phi RS1}$ is coupled over line 48 to transistor 76 to control the turning on and off of this transistor 76. The control signal $\overline{\phi RS2}$ is coupled over line 50 to control the turning on and off of the transistor 78. The control signal $\phi RS$ is coupled over the line 52 to control the turning on and off of the transistor 80.

Thus, when control signal $\overline{\phi RS1}$ and control signal $\overline{\phi RS2}$ go low, transistor 76 and transistor 78 are respectively turned off to decouple the power source $+V_{CC}$ from bit line 58 and bit line $\overline{58}$, respectively. When control signal $\overline{\phi RS1}$ and control signal $\overline{\phi RS2}$ go high, transistor 76 and transistor 78 are turned on to couple the power source $+V_{CC}$ to the bit line 58 and bit line $\overline{58}$, respectively, thereby charging these bit lines. When control signal $\phi RS$ goes high, transistor 80 is turned on to pull down or discharge bit line 58 to digital ground. When control signal $\phi RS$ goes low, transistor 80 is turned off to prevent the pulling down of the bit line 58.

With reference to FIG. 1 and FIG. 2, when control signal $\phi RSA0$ and control signal $\phi RSA1$ go high, the address buffer 26 and address buffer 28 are controlled to output a logic 0 on path 32 and a logic 0 on path 34, causing row decoder 30 to drive on simultaneously all the word lines $WL_0$-$WL_{N-1}$ via path 36A and path 36B. When control signal $\phi RSA0$ goes low, the address buffer 26 is controlled so that it can function in a normal read and write access mode and one half of the word lines $WL_0$-$WL_{N-1}$ are driven off by row decoder 30. When control signal $\phi RSA1$ goes low, the address buffer 28 is controlled so that it can function in a normal read and write access mode and the remaining on half of the word lines $WL_0$-$WL_{N-1}$ are driven off by row decoder 30, except for a currently addressed word line $WL_0$-$WL_{N-1}$. As will be further described, signal $\phi RSA0$ and signal $\phi RSA1$ have skewed transitions for going low to avoid driving off N−1 word lines $WL_0$-$WL_{N-1}$ at one time.

Figure 3:
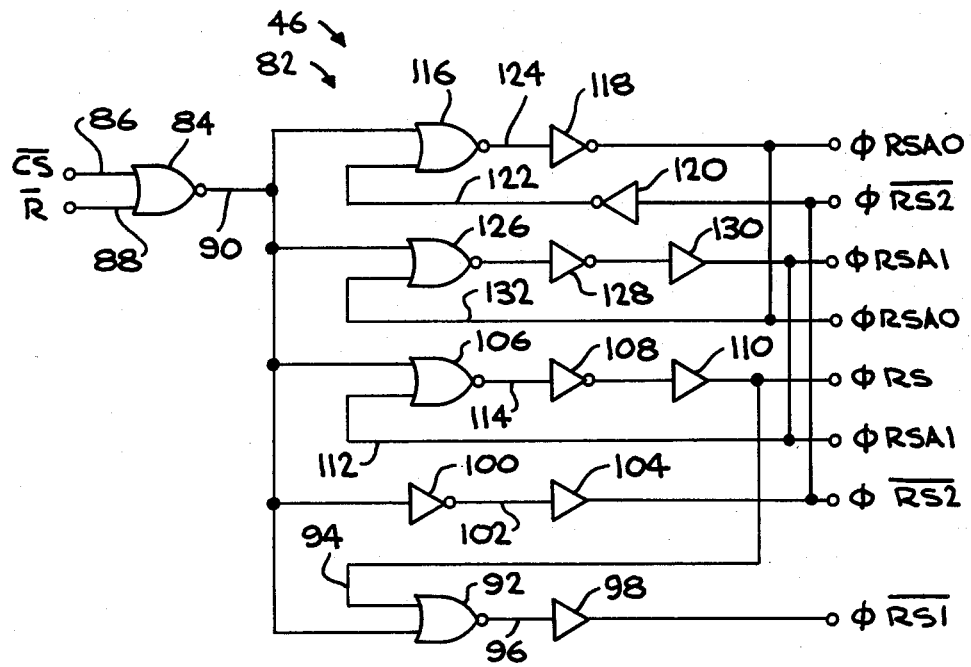
FIG. 3 shows, schematically, a control signal generator for controlling the data storage circuit of FIG. 1.
Figure 4:
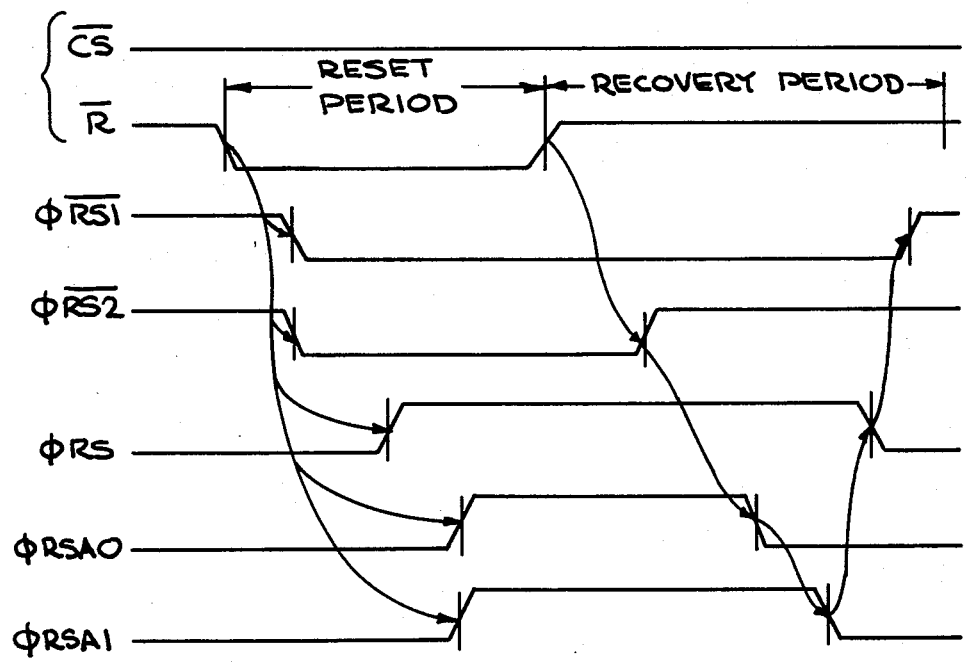
FIG. 4 is a timing diagram used to explain the signals generated by the control signal generator of FIG. 3.

FIG. 3 shows in more detail the control signal generator 46, which can be, for example, a reset buffer 82, and FIG. 4 shows the timing for the signals produced by control signal generator 46. A NOR gate 84 receives the chip select signal $\overline{CS}$ and the reset signal $\overline{R}$ over a line 86 and a line 88, respectively. With reference to FIG. 3 and FIG. 4, and assuming that the chip select signal $\overline{CS}$ is continually at a logic 0, when the reset signal $\overline{R}$ goes to a logic 0, this commences the beginning of a reset period. In response, NOR gate 84 outputs a logic 1 on a line 90. A NOR gate 92 has one input coupled to the line 90 and another input coupled to a line 94 carrying the signal φRS. At this time, the signal on line 90 is high and the control signal φRS on line 94 is low, resulting in NOR gate 92 producing a logic 0 on a line 96 and, consequently, the control signal $\overline{\phi RS1}$ via a buffer 98. An inverter 100 inverts the logic 1 on line 90 to a logic 0 on a line 102, resulting in the control signal $\overline{\phi RS2}$ being generated via a buffer 104. Thus, as shown in FIG. 4, control signal $\overline{\phi RS1}$ and control signal $\overline{\phi RS2}$ are generated at the same time, i.e., these signals go through a transistion to a logic 0 at the same time.

Thereafter, control signal φRS is generated, i.e., this signal goes to a logic 1 via a NOR gate 106, an inverter 108 and a buffer 110. At this time, NOR gate 106 has a logic 1 input on line 90 and a logic 0 control signal φRSA1 on a line 112. Thus, a logic 0 output from the NOR gate 106 on a line 114 is inverted by inverter 108 to produce the logic 1 control signal φRS via buffer 110.

The control signal φRSA0 is generated, or goes to logic 1 after the control signal φRS is generated, via a NOR gate 116 and an inverter 118. The NOR gate 116 has one input coupled to the line 90 and another input receiving the control signal $\overline{\phi RS1}$ via an inverter 120 and a line 122. Thus, with control signal $\overline{\phi RS1}$ being at logic 0 at this time and with line 90 being at logic 1, NOR gate 116 produces a logic 0 output on a line 124 which is inverted by inverter 118 to produce the control signal φRSA0.

The control signal φRSA1 is produced or goes to logic 1 via a NOR gate 126, an inverter 128 and a buffer 130. The NOR gate 126 has one input coupled to the line 90 and another input coupled to a line 132 receiving the control signal φRSA0. Thus, the control signal φRSA1 is generated at the same time as the control signal φRSA0, i.e., these signals go to logic 1 at the same time during the reset period.

In a conventional manner the time of the transitions during the reset period is determined by the size of the transistors used in the circuit of FIG. 3.

As shown in FIG. 4, a recovery period is initiated by the reset buffer 82 in response to the external reset signal $\overline{R}$ going to a logic 1, with chip select signal $\overline{CS}$ staying low. In response, first the control signal $\overline{\phi RS2}$ goes through a transition to a logic 1 via the inverter 100 and buffer 104. Then, the control signal φRSA0 goes through a transition to logic 0 via NOR gate 116 and inverter 118. Thereafter, control signal φRSA1 goes through a transition to a logic 0 via NOR gate 126, inverter 128 and buffer 130. Next, control signal φRS transitions to a logic 0 via NOR gate 106, inverter 108 and buffer 110. Finally, control signal $\overline{\phi RS1}$ transitions to a logic 1 via NOR gate 92 and buffer 98.

Thus, as indicated in FIG. 4, for the reset period, the control signals are generated at particular times with respect to each other. Similarly, for the recovery period, the transitions of these control signals also occur at particular times with respect to each other.

Reset Period

In operation, assume that the chip select signal $\overline{CS}$ is at logic 0 and that the external reset signal $\overline{R}$ is received and goes low to commence the reset period shown in FIG. 4. Thereafter, control signal $\overline{\phi RS1}$ and control signal $\overline{\phi RS2}$ are generated to turn off transistor 76 and transistor 78, respectively, of all the columns C, thereby decoupling or isolating bit line 58 and bit line $\overline{58}$ from the power source $+V_{CC}$. Next, control signal φRS is generated to turn on transistor 80 of all the bit lines 58 of all the columns C. Consequently, the bit line 58 will fully discharge through transistor 80 to ground.

Then, control signal φRSA0 and control signal φRSA1 are generated, thereby controlling the overall address buffer 24 to cause the row decoder 30 to enable simultaneously all the word lines $WL_0$-$WL_{N-1}$. At this time also, the cell nodes 64 of all the core cells $CC_0$-$CC_{N-1}$ will discharge through the respective transistors 70, bit lines 58 and transistors 80 to ground. Furthermore, the nodes 66 of each core cell $CC_0$-$CC_{N-1}$ may or may not be low at this time, thereby placing the core cells $CC_0$-$CC_{n-1}$ in an indeterminate state. That is, depending on the duration of the reset period, nodes 66 may be slowly charged high through the respective resistors 72 since the nodes 64 are always low at this time and, therefore, turn off transistors Q2.

Thus, at the end of the one reset period, all the data storage locations of the matrix M of core memory 16A and core memory 16B are reset.

Recovery Period

Then, at the beginning of the recovery period, reset signal $\overline{R}$ goes to a logic 1. Thereafter, control signal $\overline{\phi RS2}$ transitions to a logic 1 to turn on the transistors 78 of the bit line $\overline{58}$ of all the columns C. Consequently, at this time the bit lines $\overline{58}$ are charged via the power source $+V_{CC}$ which, in turn, charge the nodes 66 of each core cell $CC_0$-$CC_{N-1}$ via transistors 74 to a logic 1. Thus, at this time all the core cells $CC_0$-$CC_{N-1}$ of the matrix M of core memory 16A and core memory 16B store one data state, i.e., a logic 0 in the current example.

Thereafter, control signal φRSA0 transitions to a logic 0, resulting in controlling address buffer 26 to function in a normal read and write access mode and, thereby, enabling row decoder 30 to turn off one half of the word lines $WL_0$-$WL_{N-1}$. Next, control signal φRSA1 goes to a logic 0 to control address buffer 28 to function for normal read and write accesses and, thereby, enabling row decoder 30 to turn off the remaining one half of the word lines $WL_0$-$WL_{N-1}$, except for a currently addressed word line $WL_0$-$WL_{N-1}$. Next, control signal φRS transitions to a logic 0 to turn off the transistors 80 of the bit lines 58 of all of the columns C. Finally, control signal $\overline{\phi RS1}$ transitions to a logic 1 to turn on the transistors 76 and, thereby, recover the entire SRAM 16 for performing normal read or write operations.

As shown, control signal φRSA0 and control signal φRSA1 have skewed transitions relative to one another during the recovery period. The result, as mentioned above, is that only one half of the rows R or word lines WL of SRAM 16 are deactivated at one time. This is done to avoid potential damaging excessive transient current surges when the word lines WL, which were charged during the reset period, are now discharged during the recovery period. It can be appreciated, therefore, that for an SRAM 16 in which these current surges are not a problem, all the word lines WL can be deactivated at once by using only one control signal φRSA (i.e., signal φRSA0 or φRSA1) and combining buffer 26 and buffer 28 into one buffer 24.

Thus, in accordance with the present invention, the contents of an entire data storage circuit 10 can be changed to a desired data state at one time, without having to individually change the data words to the desired data state.

The foregoing description of a preferred embodiment of the invention has been presented for purposes of illustration and description. It is not intended to be exhaustive or to limit the invention to the precise form disclosed, and obviously many modifications and variations are possible in light of the above teaching. The embodiment was chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A memory apparatus comprising;
   a plurality of rows of bistable memory cells, each of said cells having a first and a second node coupled to a first and a second bit line, respectively,
   means for discharging to a first predetermined potential, simultaneously, said first node of all of said cells via said first bit line; and
   means for charging to a second predetermined potential, simultaneously, said second node of all of said cells via said second bit line after said first node of all of said cells has been discharged.

2. Apparatus, according to claim 1, comprising a power source for charging said first and second bit lines and row address decoder means, and wherein said discharging means comprises:
   (a) means for generating first and second signals to isolate said first and second bit lines, respectively, from the power source and to selectively couple said first and second bit lines to said power source at different times after they have been isolated therefrom;
   (b) means for generating a third signal to couple the first bit line to ground when said first bit line is isolated from said power source; and
   (c) means for generating a fourth and a fifth signal to control the row address decoder means to simultaneously couple the first node of all of said cells to said first bit line and thereby discharge said first node of all of said cells to ground and to thereafter selectively decouple said first node of selected ones of said cells from said first bit line at different times to limit current flow in said fourth and fifth signal generating means.

3. Apparatus, according to claim 2, wherein the first bit line has a first transistor and each of the second bit lines has a second transistor, and wherein said first signal turns off the first transistor and said second signal turns off the second transistor.

4. Apparatus, according to claim 3, wherein the first bit line includes a third transistor being coupled to discharge the first bit line and said third signal is generated to turn on said third transistor.

5. Apparatus, according to claim 4, wherein said first signal and said second signal are generated simultaneously, said third signal is generated after said first signal and said second signal are generated, and said fourth signal is generated after said third signal is generated.

6. Apparatus, according to claim 2, wherein said second signal generating means comprises:
   means for producing a transition of said second signal to couple the second bit line to the power source to charge the second bit line while the first bit line is discharged and the first node of all of said cells is coupled to said first bit line.

7. Apparatus, according to claim 6, wherein said fourth and fifth signal generating means comprises:
   means for producing a transition of the fourth and fifth signals to control the row address decoder means to individually couple said second node of said first and said second sets, respectively, to said second bit line.

8. Apparatus, according to claim 7, comprising;
   means for producing a transition of the third signal to enable the charging of the first bit line.

9. Apparatus, according to claim 8, comprising;
   means for producing a transition of the first signal to charge the first bit line.

10. Apparatus, according to claim 9, wherein the transition of the second signal occurs first, the transition of the fourth signal occurs after the transition of the second signal, the transition of the third signal occurs after the transition of the fourth signal and the transition of the first signal occurs after the transition of the third signal.

11. An apparatus according to claim 1 wherein said plurality of rows of bistable memory cells comprises a first and a second set of rows of said memory cells, said discharging means comprises means for discharging to said first predetermined potential, simultaneously, said first node of all of said cells in said first and said second sets of rows of said memory cells and said charging means comprises means for decoupling said second node of all of said memory cells to a source of said second predetermined potential for charging to said second predetermined potential, simultaneously, said second node of all of said cells in said first and said second sets of rows of said memory cells, said coupling means comprising means responsive to a first and a second control signal for decoupling from said source of said second predetermined potential said second node of all of said cells in said first set of rows at a first predetermined time and said second node of all of said cells in said second set of rows at a subsequent second predetermined time, respectively.

12. An apparatus according to claim 11 wherein said first and said second predetermined potentials correspond to first and second logical levels, respectively.

13. An apparatus according to claim 12 wherein said first and said second logical levels comprise a logical low and a logical high, respectively.

14. A memory circuit for storing data words, comprising:
   (a) a core memory, having a matrix of a plurality of addressable rows and columns, for storing the data words, each of said columns including first and second bit lines, said core memory having a plurality of core cells, wherein each of said cells has a first and second node coupled to said first and second bit lines, respectively, for storing bits of the data words, each of said core cells being accessed in response to addressing one of the said addressable rows;
   (b) row address decoder means for driving on said plurality of addressable rows; and
   (c) means for changing the content of the data words of said core memory, including
      (i) first means for controlling each of said first and second bit lines and said row address decoder means to simultaneously discharge to ground said first node of said plurality of core cells to a first predetermined potential via said first bit line; and (ii) second means for controlling each of said first and second bit lines and said row address decoder means to simultaneously charge said second node of said plurality of core cells to a second predetermined potential via said second bit line after said first node of all of said cells has been discharged.

15. A memory circuit, according to claim 14:
(a) wherein each of said first bit lines has a first transistor for coupling a charging current to each of said plurality of core cells;
(b) wherein each of said second bit lines has a second transistor for coupling a charging current to each of said plurality of core cells; and
(c) wherein said first means for controlling includes
 (i) means for generating a first signal to selectively turn on and off said first transistor; and
 (ii) means for generating a second signal to selectively turn on and off said second transistor, said generating means including means for turning on said first and said second transistor at different times.

16. A memory circuit, according to claim 15:
(a) wherein each of said first bit lines has a third transistor for discharging said first node of each of said plurality of core cells; and
(b) wherein said first means for controlling includes means for generating a third signal to turn on said third transistor.

17. A memory circuit, according to claim 16, wherein said first means for controlling includes means for generating a fourth signal to control said row address decoder means to simultaneously drive on said plurality of addressable rows.

18. A memory circuit, according to claim 17, wherein said first signal and said second signal are generated simultaneously, said third signal is generated after said first signal and said second signal are generated, and said fourth signal is generated after said third signal is generated.

19. A memory circuit, according to claim 17, wherein said second means for controlling produces a transition of said second signal to turn on said second transistor to simultaneously charge said second node.

20. A memory circuit, according to claim 19, wherein said second means for controlling produces a transition of said fourth signal to control said row address decoder means to drive off said plurality of addressable rows except for a currently addressed row.

21. A memory circuit, according to claim 20, wherein said second means for controlling produces a transition of said third signal to turn off said third transistor.

22. A memory circuit, according to claim 21, wherein said second means for controlling produces a transition of said first signal to turn on said first transistor.

23. A memory circuit, according to claim 22, wherein said transition of said second signal occurs first, said transition of said fourth signal occurs after said transition of said second signal, said transition of said third signal occurs after said transition of said fourth signal, and said transition of said first signal occurs after said transition of said third signal.

24. A static random access memory circuit, comprising:
(a) a first core memory for storing first data words, said first core memory having a first matrix of first addressable rows and first columns, said first core memory having a first plurality of core cells for storing bits of the first data words, each of said first columns including first and second bit lines, each of said first bit lines having a first transistor for coupling charge current to said first plurality of core cells, each of said second bit lines having a second transistor for coupling charge current to said first plurality of core cells, and each of said first bit lines having a third transistor for discharging said first plurality of core cells;
(b) a second core memory for storing second data words, said second core memory having a second matrix of second addressable rows and second columns, each of said second columns including third and fourth bit lines, said second core memory having a second plurality of core cells for storing bits of the second data words, each of said third bit lines having a fourth transistor for coupling charge current to said second plurality of core cells, each of said fourth bit lines having a fifth transistor for coupling charge current to said second plurality of core cells, and each of said third bit lines having a sixth transistor for discharging said second plurality of core cells;
(c) row address decoder means for driving on said first rows and said second rows; and
(d) reset buffer means, responsive to a reset signal, for changing the content of the first data words of said first plurality of core cells and the content of the data words of said second plurality of core cells to one data state, said reset buffer means being operative over a reset period and a recovery period;
(e) wherein said reset buffer means generates, during said reset period, a first signal to turn off said first transistor and said fourth transistor, a second signal to turn off said second transistor and said fifth transistor, a third signal to turn on said third transistor and said sixth transistor, and a fourth signal and a fifth signal to control said row address decoder means to simultaneously drive on said first rows and said second rows, said first signal and said second signal being generated simultaneously, said third signal being generated after said first signal and said second signal are generated, and said fourth signal and said fifth signal being generated simultaneously after said third signal is generated; and
(f) wherein said reset buffer means, during said recovery period, and in sequence, produces a transition of said second signal to turn on said second transistor and said fifth transistor, a transition of said fourth signal to control said row address decoder means to drive off one half said first rows and said second rows, a transition of said fifth signal to control said row address decoder means to drive off the remaining one half of said first rows and said second rows, except for a currently addressed row, a transition of said third signal to turn off said third transistor and said sixth transistor and a transition of said first signal to turn on said first transistor and said fourth transistor.

* * * * *